(12) United States Patent
Johnston et al.

(10) Patent No.: US 6,377,198 B1
(45) Date of Patent: Apr. 23, 2002

(54) DEFINITION OF PHYSICAL LEVEL OF A LOGIC OUTPUT BY A LOGIC INPUT

(75) Inventors: Jerome Johnston, Austin, TX (US); Saibun Wong; Qicheng Yu, both of Nashua, NH (US); Douglas F. Pastorello, Hudson, NH (US)

(73) Assignee: Cirrus Logic Inc., Austin, TX (US)

( * ) Notice: Subject to any disclaimer, the term of this patent is extended or adjusted under 35 U.S.C. 154(b) by 0 days.

(21) Appl. No.: 09/596,156

(22) Filed: Mar. 20, 2000

(51) Int. Cl.[7] ............................................... H03M 3/00
(52) U.S. Cl. ...................................... 341/143; 341/122
(58) Field of Search .............................. 341/143, 122, 341/120, 156, 121, 134, 114, 136, 118, 126, 172; 323/9; 340/347 AD

(56) References Cited

U.S. PATENT DOCUMENTS

| | | | |
|---|---|---|---|
| 4,174,496 A | * 11/1979 | McFall et al. .................. | 323/9 |
| 4,746,899 A | * 5/1988 | Swanson et al. ............. | 340/347 |
| 5,719,573 A | 2/1998 | Leung et al. | |
| 5,907,299 A | * 5/1999 | Green et al. ................. | 341/143 |
| 6,147,631 A | * 11/2000 | Maulik et al. ............... | 341/122 |

OTHER PUBLICATIONS

"Crystal CS5510/11/12/13 16 and 20–Bit, 8–Pin ΔΣ ADC", Cirrus Logic, Inc., Sep. 1999.*

"Linear Technology LTC2400 24–Bit μPower ΔΣ ADC in SO–8", Linear Technology Corporation, 1998.

* cited by examiner

Primary Examiner—Brian Young
Assistant Examiner—John Nguyen
(74) Attorney, Agent, or Firm—Steven Lin; Robert Platt Bell

(57) ABSTRACT

The present invention provides a method and apparatus to define and sustain such a physical level by connecting the output through a transmission gate to an input pin. For a certain state of the output, one level of an input may be fed through to the output to generate an output voltage level. In the preferred embodiment of the present invention, a chip select signal $\overline{CS}$ is used to define a low level logic signal. An control logic selectively switches a high level logic signal voltage (e.g., V+supply voltage) or the low level logic signal voltage ($\overline{CS}$) to produce an output digital logic signal. In a further embodiment of the present invention, separate logic level signals $IN_H$ and $IN_L$ may be selectively switched by control logic to generate an output logic level signal independent of supply voltages V+ and V−.

28 Claims, 5 Drawing Sheets

DEFINITION OF PHYSICAL LEVEL OF A LOGIC OUTPUT BY A LOGIC INPUT

CROSS-REFERENCE TO RELATED APPLICATIONS

The subject matter of the present application is related to that in U.S. patent application Ser. No. 09/466,835, filed Dec. 20, 1999, entitled "Techniques for Improving Signal to Noise Ratio in a Digital Filter using Spread Zeros" (Nanda), and U.S. patent application Ser. No. 09/521,675 filed concurrently herewith, entitled "Single Wire Interface for Analog-to-digital Converter" (Pastorello et al.) both of which are incorporated herein by reference.

FIELD OF THE INVENTION

The present invention relates to the field of semiconductor devices. In particular, the present invention relates to an apparatus for controlling the voltage level of a logic output in relation to the logic input voltage level.

BACKGROUND OF THE INVENTION

For a chip working in a multiple supply environment, the physical voltage level of an output pin may be different from every supply to the chip. For example, an analog-to-digital converter may be supplied by a so-called dual supply power supply with a V+of +3 Volts and a V− of −2 Volts. Alternately, other supply voltages may be used, such as a V+ of +5 Volts and a V− of 0 Volts.

Digital signal levels within such circuitry may have voltage levels different than supply voltage levels. Thus, in the examples given above, a high logic level may be 3 Volts and a low logic level may be 0 Volts. Logic level voltages may or may not correspond to input supply voltages.

As a result, there is no simple technique for generating appropriate and consistent voltage levels for output digital signals on such a chip. In addition, if a chip is designed to work with various voltage supply levels, generating consistent and accurate logic level signals relative to supply voltage levels may be somewhat difficult.

One intuitive approach to solving these problems is to provide an additional input reference voltage signal or signals through a corresponding separate input pin or pins representing one or more logic levels. However, such an approach requires one or more extra input pins for such reference voltage signals.

In semiconductor chip design, it is desirable to reduce the number of input, output, or voltage supply pins in order to reduce package size and reduce cost. Thus, using an additional pin or pins for reference voltage signals may not be an acceptable solution.

SUMMARY OF THE INVENTION

The present invention provides a method and apparatus to define and sustain such a physical level by connecting the output through a transmission gate to an input pin. For a certain state of the output, one level of an input may be fed through to the output to generate an output voltage level.

In the preferred embodiment of the present invention, a chip select signal $\overline{CS}$ is used to define a low level logic signal. An control logic selectively switches a high level logic signal voltage (e.g., V+ supply voltage) or the low level logic signal voltage ($\overline{CS}$) to produce an output digital logic signal.

In a further embodiment of the present invention, separate logic level signals $IN_H$ and $IN_L$ may be selectively switched by a control logic to generate an output logic level signal independent of supply voltages V+ and V−.

DETAILED DESCRIPTION OF THE INVENTION

Figure 1:
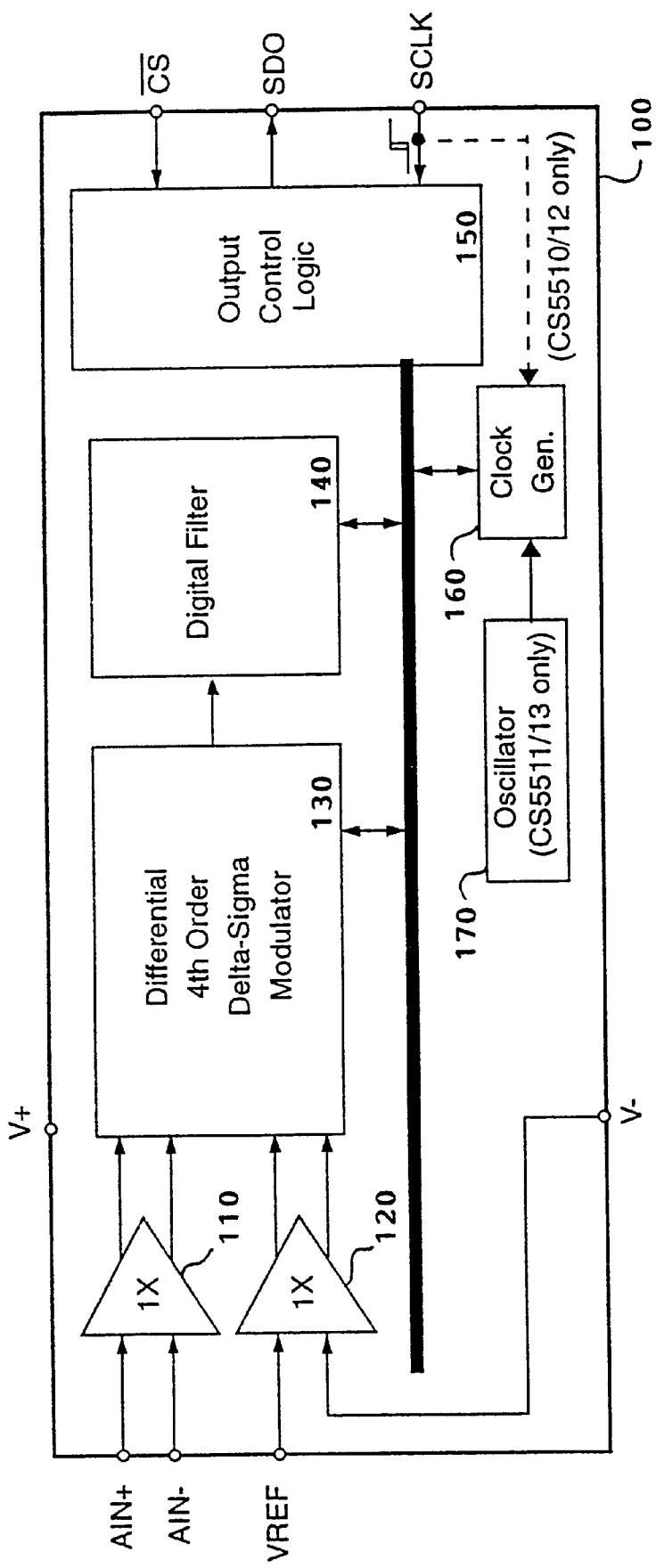
FIG. 1 is a block diagram of a single channel differential input analog-to-digital converter.

FIG. 1 is a block diagram of a single channel differential input analog-to-digital converter 100. In the diagram of FIG. 1, the rectangular border represents the boundary of the chip, while the white circles on that border represent input, output, or supply pins for the chip. FIG. 1 is taken from the CRYSTAL CS5510/11/12/13 data sheet, DS337PP2, September 1999, incorporated herein by reference in its entirety.

Both the analog differential signal inputs AIN− and AIN+ as well as reference input VREF are buffered through respective buffers 110 and 120 to reduce input current requirements. The analog outputs of buffers 110 and 120 are fed to a differential 4th order delta-sigma modulator 130 which converts the analog input to produce a digital data stream to digital filter 140. Such delta-sigma modulators are discussed, for example, in Leung et al., U.S. Pat. No. 5,719,573, incorporated herein by reference.

Digital filter 140 may comprise, for example, a spread zero filter to convert single bits to a multiple bit representation, reducing the word rate in the process. An example of such a spread zero filter is disclosed, for example, in copending application Ser. No. 09/466,835 entitled "Techniques for Improving Signal to Noise Ratio in a Digital Filter using Spread Zeros" (Nanda) filed on Dec. 20, 1999 and incorporated herein by reference.

Output from digital filter 140 may then be fed to output control logic 150. Output control logic 150 may output digital data through a simple serial output line SDO in response to chip select signal $\overline{CS}$. When chip select signal $\overline{CS}$ goes low, output control logic 150 outputs digital data. When signal $\overline{CS}$ goes high, the output SDO may be tri-stated.

Depending upon application, either SCLK, $\overline{CS}$ or a combination of signals may be used to control data output. For example, in some applications, signal $\overline{CS}$ may be held low, enabling the chip at all times and data output controlled by activating or deactivating signal SCLK. In other applications (particularly where signal SCLK is used as a system source clock) signal SCLK may be continually activated and data flow controlled by toggling signal $\overline{CS}$. In yet other applications, control of both signals $\overline{CS}$ and SCLK may be used to control data flow from single channel differential input analog-to-digital converter 100.

Signal SCLK is a clock signal used to shift data out from output control logic 150. Clock generator 160 may be used to generate a clock signal for single channel differential input analog-to-digital converter 100 based upon either a signal from oscillator 170 or from signal SCLK. This internal clock signal may be used, for example, to clock differential $4^{th}$ order delta-sigma modulator 130, as well as clocking data within the device.

As illustrated in FIG. 1, oscillator 170 may be used as a source clock signal in one version of single channel differential input analog-to-digital converter 100 (e.g., part numbers CS5511/13) whereas SCLK may be used as a source clock signal in another version of single channel differential input analog-to-digital converter 100 (e.g., part numbers CS5510/12). Different versions of the same chip may be enabled as a so-called bond-wire option The actual semiconductor chip for all four parts (CS5510/11/12/13) may be substantially or completely identical. However, depending on how the chip is wire-bonded to the die (packaging) may determine whether the resultant device uses SCLK or internal oscillator 170 as a clock source. A corresponding pad within the chip may be tied to supply voltage or ground to enable one mode or the other.

Supply voltages V+ and V− may take respective ones of a number of predetermined voltage levels, depending upon application. For example, in one application, V+ may be +5 Volts and V− may be ground. In another application, V+ may be +3 Volts and V− may take on a value of −2 Volts. In still another application, V+ may be +2.5 Volts and V− may be −2.5 Volts. Other voltage levels are possible within the spirit and scope of the present invention. In general, there may be a predetermined spread between these voltage levels (e.g., 5 Volts difference).

Output logic levels for serial data SDO, on the other hand, may have high and low logic levels independent of supply voltages V+ and V−. For example, in one environment, a low logic level may be defined as 2 Volts, whereas a high logic level may be defined as 5 Volts. In another application, low logic level may be defined as 0 Volts, and a high logic level as 5 Volts. In yet another case, the low logic level may be 1 Volt and the high logic level may be 4 Volts. All of these possible logic levels may or may not correspond to input supply voltage levels. Thus, it is desirable to be able to generate correct output logic levels which is consistent regardless of supply voltage levels.

In the example of high logic level of 4 Volts and low logic level of 1 Volt, neither of the example power supply voltage levels (+5 Volts/0 Volts or +3 Volts/−2 Volts) may supply the correct logic levels.

Figure 3:
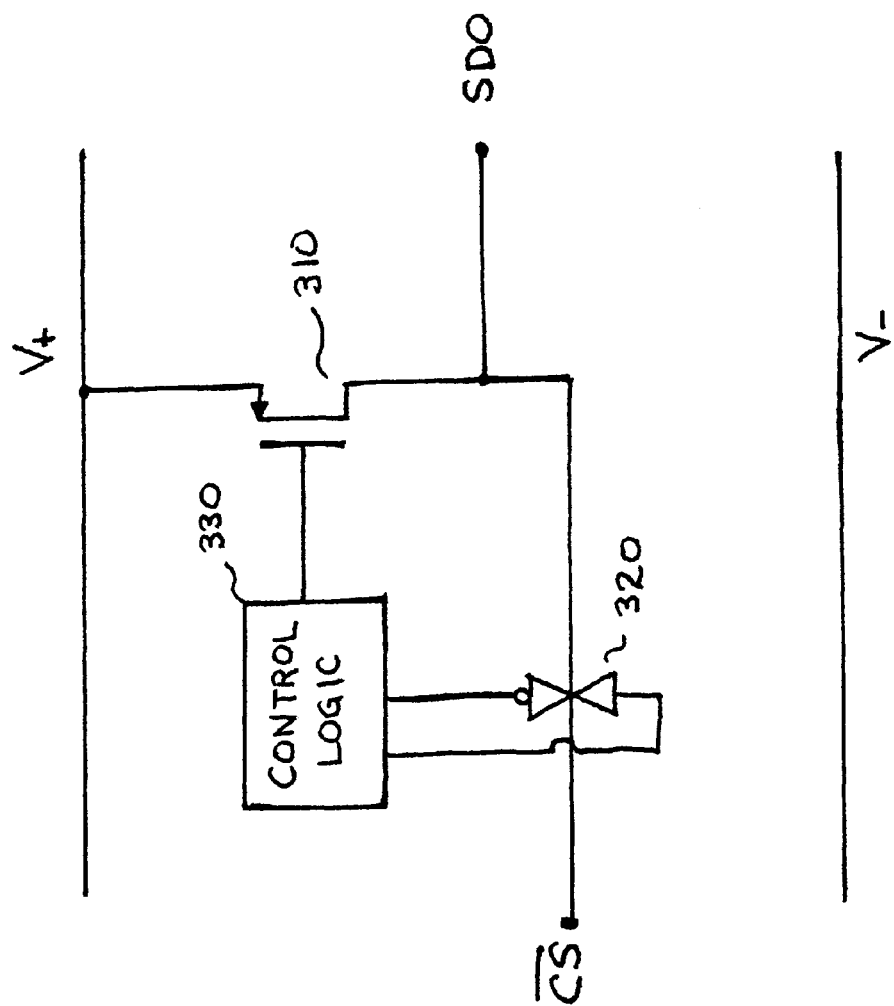
FIG. 3 is a simplified schematic of the preferred embodiment of an output level generating circuit of the present invention.

FIG. 3 is a simplified schematic of a preferred embodiment of an output level generating circuit of the present invention. In the embodiment of FIG. 3, a desired output level for a high logic level signal may be equal to supply voltage V+ (e.g., 5 Volts) whereas the low level logic signal may take some other value unequal to either of the supply voltages V+ or V−.

Signal $\overline{CS}$ may take one of two values. When signal $\overline{CS}$ is high, the device is de-selected (hence the term "chip select") and the output of signal SDO may be tri-stated. When signal $\overline{CS}$ is low, the device is selected (enabled). In the application of FIG. 3, the low value for signal $\overline{CS}$ may be utilized as the low value for output data for signal SDO.

Control logic 330 represents an abstraction of the output control logic 150 of FIG. 1. As may be readily appreciated by one of ordinary skill in the art, the present invention may be applied to circuits other than analog-to-digital converters. Thus, control logic 320 may represent output control logic 150 of FIG. 1, or some other type of digital signal generator.

Control logic 330 may generate a high level logic signal for serial data output SDO by activating P-type MOSFET 310. When P-type MOSFET 310 is activated, serial data output signal SDO becomes equal to voltage V+, minus any voltage drop across P-type MOSFET 310 (e.g., 0.6 Volts). The resulting voltage is defined as the high logic level signal in this instance. A P-type MOSFET is selected in this particular embodiment, as the relatively high voltage from V+ results in a low voltage drop (e.g., 0.6 Volts) across p-type MOSFET 310 (as opposed to an n-type MOSFET).

Control logic 330 may generate a low level logic signal for serial data output SDO by activating T-gate 320. When T-gate 320 is activated, serial data output signal SDO becomes equal to the voltage of signal $\overline{CS}$ (chip select), minus any voltage drop (e.g., 0.6 Volts) across T-gate 320. The resulting voltage is defined as the low logic level signal in this instance.

A T-gate is selected in this particular embodiment, as the voltage levels of signal $\overline{CS}$ may vary from application to application. If $\overline{CS}$ has a relatively high voltage level, a p-type device may be appropriate to provide a low voltage drop (e.g., 0.6 Volts). When $\overline{CS}$ has a relatively low voltage level, an n-type device may be appropriate to prove a low voltage drop. Thus, selecting a p-Type MOSFET or n-Type MOSFET may or may not be suitable, depending on the voltage range of $\overline{CS}$. A T-gate, on the other hand, will provide a low voltage drop for all applications.

A T-gate may also be used in place of P-type MOSFET 310 without departing from the spirit and scope of the present invention. However, since voltage V+ in this application will always be relatively high, a p-type MOSFET will be more than suitable and moreover less expensive (in terms of transistor count) to implement.

Figure 2:
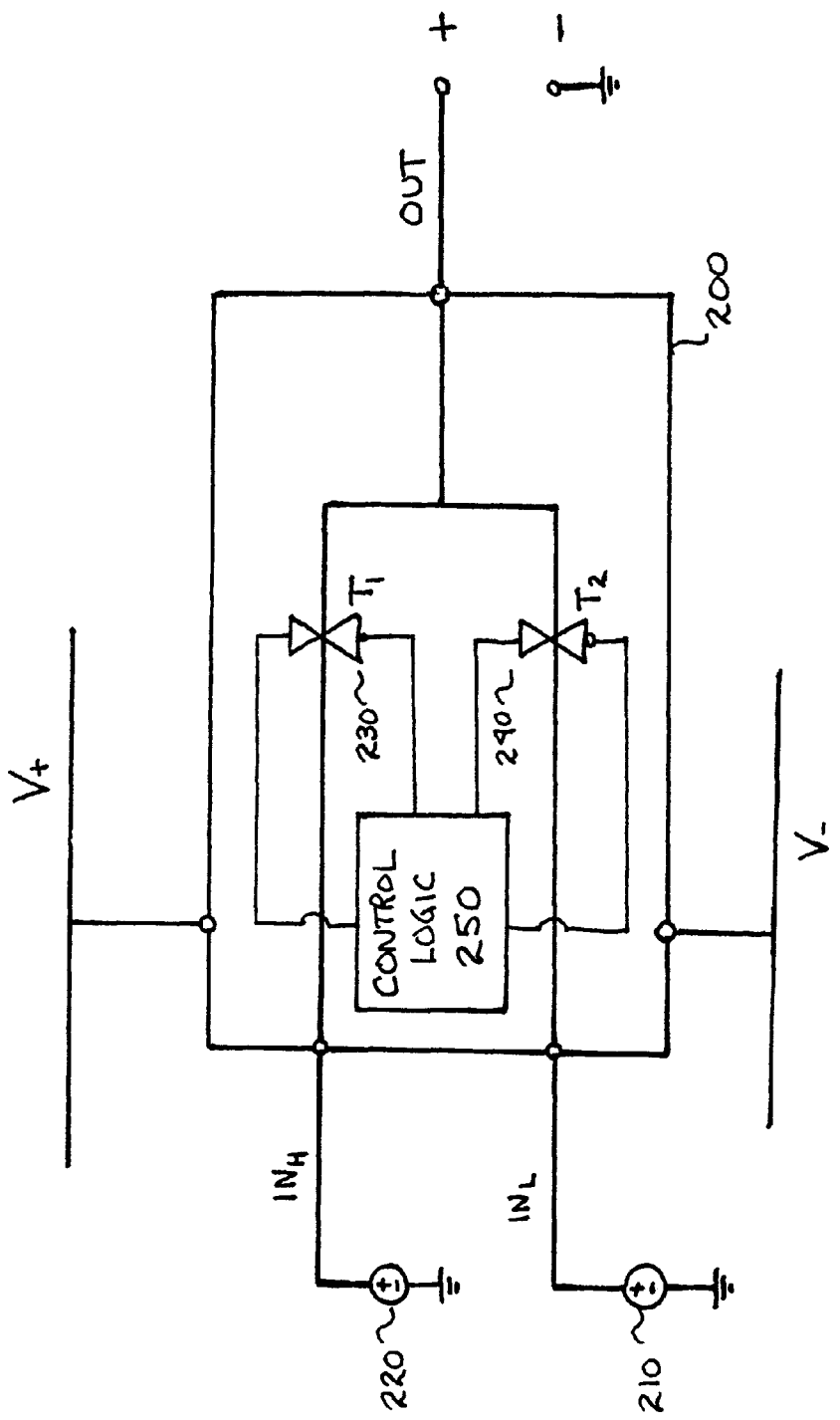
FIG. 2 is a simplified schematic of some components of the single channel differential input analog-to-digital converter in an is alternative embodiment of the present invention.

FIG. 2 is a simplified schematic of some components of the single channel differential input analog-to-digital converter in an alternative embodiment of the present invention. Again, as in the diagram of FIG. 1, the rectangular border 200 represents the boundary of the chip, while the white circles on that border represent input, output, or supply pins for the chip.

Whereas the embodiment of FIG. 3 utilized only one input value ($\overline{CS}$) to generate an output logic level, the apparatus of FIG. 2 generalizes the basic concept to a situation where two input signal values are used to generate both high and low logic level signals. Signal $IN_L$ may represent a low logic level signal generated by voltage source 210 (e.g., $\overline{CS}$) Signal $IN_H$ may represent a high level logic signal generated by voltage source 220. Signals $IN_L$ and $IN_H$ may have voltage levels different from supply voltage V+ and V−.

Control Logic 250 may be analogous to output control logic 150 of FIG. 1, or may a general logic signal generating circuit. T-gates 230 and 240 may be used to selectively switch input signals $IN_H$ and $IN_L$, respectively as output signal OUT. As in FIG. 3, one or both of T-gates 230 and 240 may be substituted by an appropriate N-type or P-type MOSFET, if the expected voltage range of $IN_H$ or $IN_L$ allows such an economy in design.

Figure 4:
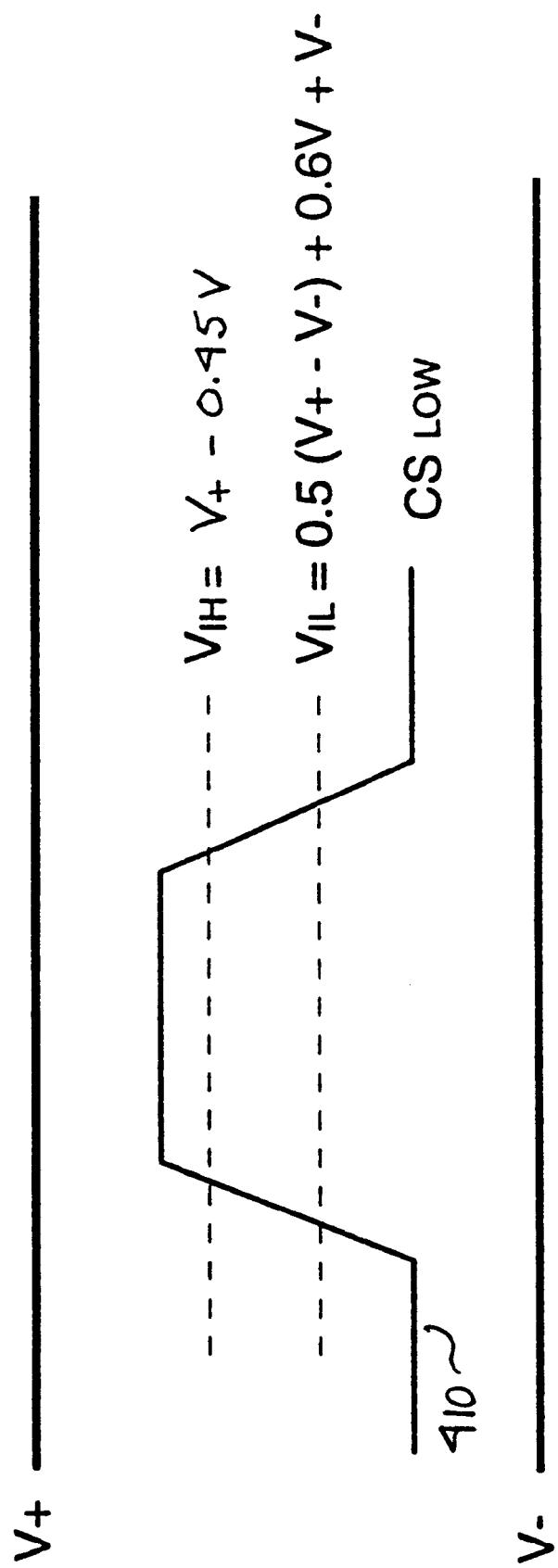
FIG. 4 is a graph illustrating the relationship between logic threshold levels, supply voltage levels, and chip select signal $\overline{CS}$.
Figure 5:
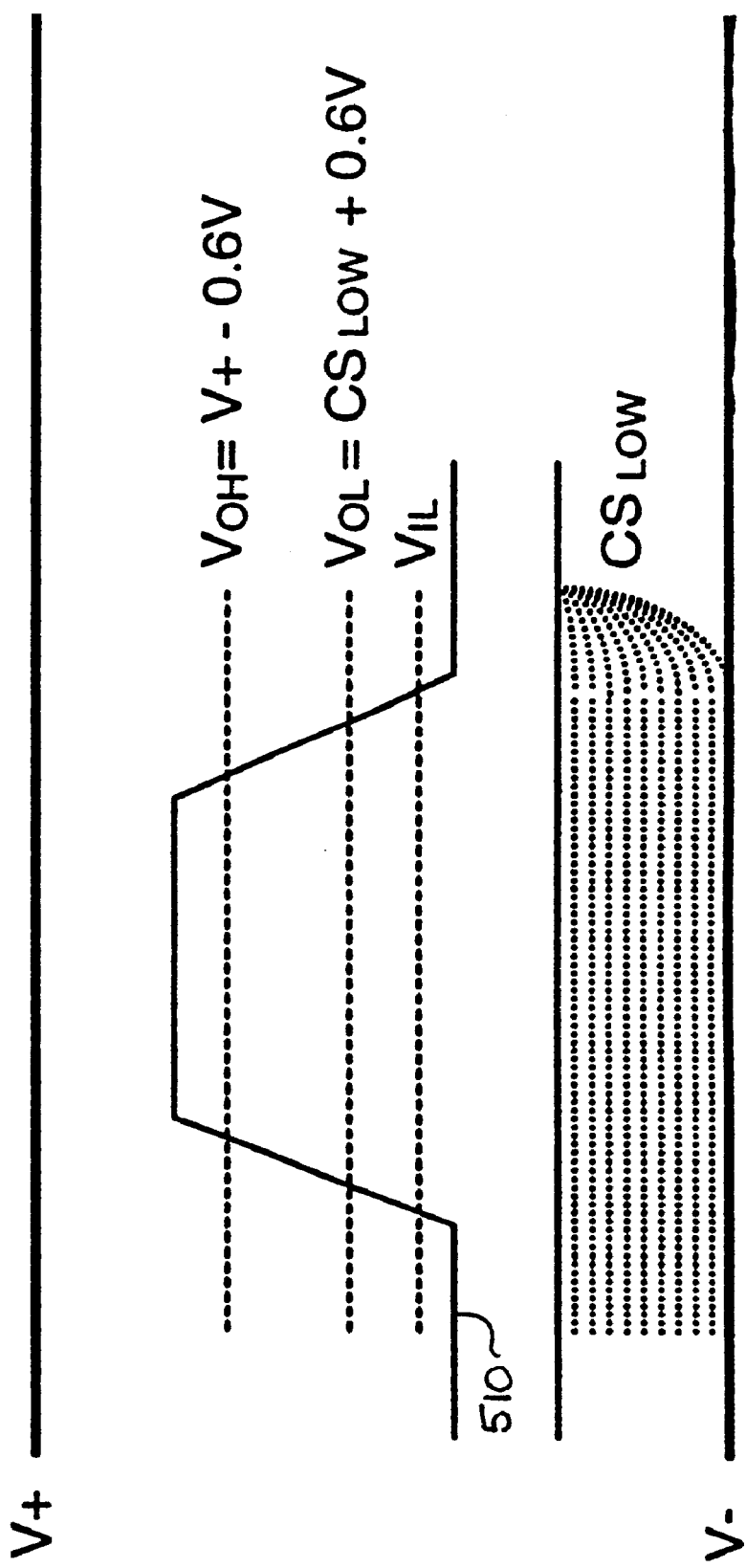
FIG. 5 is a graph illustrating the relationship between output logic threshold levels, supply voltage levels, and chip select signal $\overline{CS}$.

Note also that the embodiment of FIG. 2 is a generalization of the invention for a situation where both high and low logic levels are not defined by V+ and V−. In a similar manner to the embodiment of FIG. 3, a further alternative embodiment may be provided where a low level logic signal is defined by supply voltage V− and the high level logic signal defined by an input voltage FIGS. 4 and 5 illustrate the potential relationships between logic levels and supply voltages, as well as logic level thresholds for the preferred embodiment of the present invention as illustrated in FIG. 3. FIG. 4 is a graph illustrating the relationship between input logic threshold levels, supply voltage levels, and chip select signal $\overline{CS}$. In FIG. 4, signal waveform 410 represents a digital logic signal having high and low logic levels as well as transitions between high and low logic levels. Such input signal waveforms may include, for example, chip select signal $\overline{CS}$ and data clocking signal SCLK.

As illustrated in FIG. 4, the high and low logic levels may be independent of supply voltages V+ and V−. In particular, a low logic level may be considered equivalent to $\overline{CS}$, as this signal is a low level logic signal generated from the environment in which the device is operating. Threshold values for input signals are shown as $V_{IH}$ and $V_{IL}$, which are determined as a function of supply voltage levels. An input above $V_{IH}$ will be interpreted as a high logic level. If an input signal is below $V_{IL}$, it will be interpreted as a low logic level signal.

In the example of FIG. 4, $V_{IH}$ may be set as supply voltage V+ minus a constant value of 0.45 Volts. $V_{IL}$ may be set as half of the difference between supply voltages V+ and V−, plus a constant 0.6 Volts, minus supply voltage V−. Table I illustrates the resultant input threshold voltage limits for a number of example supply voltages V+ and V−.

TABLE I

| V+ | V− | $V_{IH}$ | $V_{IL}$ |
|---|---|---|---|
| +5 | 0 | 4.55 V | 3.1 V |
| +2.5 | −2.5 | 2.05 V | 0.6 V |
| +3 V | −2 V | 2.55 V | 1.1 V |
| +4 V | −1 V | 3.55 | 2.1 V |

Note that regardless of supply voltages V+ and V−, the threshold levels may be automatically adjusted to compensate for variations in supply voltage. Thus, regardless of logic levels within the operating environment (within a reasonable range), the device will properly interpret logic high and low levels based upon input thresholds calculated from supply voltage levels. The formula values illustrated in FIG. 4 are selected to allow proper high and low level logic level determination.

FIG. 5 is a graph illustrating the relationship between output logic threshold levels, supply voltage levels, input logic level $V_{IL}$, and chip select signal $\overline{CS}$. As in FIG. 4, signal waveform 510 represents a digital logic signal having high and low logic levels as well as transitions between high and low logic levels.

As illustrated in FIG. 5, the high and low logic levels may be independent of supply voltages V+ and V−. In particular, a low logic level may be considered roughly equivalent to $\overline{CS}$, as this signal is a low level logic signal generated from the environment in which the device is operating. Threshold values for output signals are illustrated as $V_{OH}$ and $V_{OL}$. In this instance, $V_{OH}$ is dependent on V+ and $V_{OL}$ a function of $\overline{CS}$ (See FIG. 3). An output above $V_{OH}$ will be interpreted as a high logic level. If an output signal is below $V_{OL}$, it will be interpreted as a low logic level signal.

In the example of FIG. 5, $V_{OH}$ may be set as supply voltage V+ minus a constant value of 0.6 Volts. $V_{OL}$ may be set equal to the value of $\overline{CS}$ plus a constant 0.6 Volts. Table II illustrates the resultant output threshold voltage limits for a number of example supply voltages V+ and V−.

TABLE II

| V+ | V− | $V_{OH}$ | $V_{OL}$ |
|---|---|---|---|
| +5 | 0 | 4.4 | $\overline{CS}$ + 0.6 V |
| +2.5 | −2.5 | 1.9 V | $\overline{CS}$ + 0.6 V |
| +3 V | −2 V | 2.4 V | $\overline{CS}$ + 0.6 V |
| +4 V | −1 V | 3.4 | $\overline{CS}$ + 0.6 V |

Note that regardless of supply voltage V+, the high logic level threshold $V_{OH}$ may be automatically adjusted to compensate for variations in supply voltage. On the other hand, output supply voltage threshold level $V_{OL}$ fluctuates as a function of signal $\overline{CS}$. In the formulas of FIG. 4, the voltage constant 0.6 Volts represents the voltage drop across a MOSFET or T-gate.

It should also be noted that the equations set forth in FIG. 4 and Table II may also be suitably altered for an embodiment where both high and low level logic signals are referenced from system sources $IN_H$ and $IN_L$ as in FIG. 2. In such an embodiment, threshold voltage levels for both high and low levels of the logic signal may be made a function of input values $IN_H$ and $IN_L$.

While the preferred embodiment and various alternative embodiments of the invention have been disclosed and described in detail herein, it may be apparent to those skilled in the art that various changes in form and detail may be made therein without departing from the spirit and scope thereof.

For example, while illustrated in the context of an analog-to-digital converter, the present invention. may also be applied to other circuits where one or more of input or output logic levels may be independent of supply voltage levels V+ and V−.

We claim:

1. An integrated circuit for use in an electrical system having at least one predetermined logic voltage level, the integrated circuit comprising:

at least one power supply input, for receiving a power supply voltage level unequal to and independent from, the predetermined logic voltage level;

at least one signal input, for receiving a logic signal having the at least one predetermined logic voltage level during at least one interval;

control logic, coupled to the power supply input, for generating a digital signal;

a signal output, for outputting a digital logic signal from the integrated circuit; and switching means, coupled to the control logic, the signal output, and the at least one signal input, for selectively switching the at least one signal input to the signal output, in response to the control logic, so as to generate the digital logic signal having at least one voltage level substantially equal to the at least one predetermined logic voltage level.

2. The integrated circuit of claim 1, wherein said at least one power supply input further comprises:

at least two power supply inputs, comprising at least a V+ input and a V− input, each for receiving respective power supply voltage levels unequal to and independent from, the predetermined logic voltage level.

3. The integrated circuit of claim 2, wherein said integrated circuit comprises an analog-to-digital converter, said integrated circuit further comprising:

at least one analog input for receiving an analog input signal;

at least one buffer amplifier, coupled to said at least one analog input, for reducing current draw of the at least one analog input;

a differential 4th order delta-sigma modulator, coupled to the at least one analog input, for generating a digital bitstream value corresponding to the analog input signal; and a digital filter for converting the digital bitstream value into a multiple bit representation to reducing word rate.

4. The integrated circuit of claim 3, wherein said at least one signal input further comprises:

a chip select signal input, for receiving a low level logic signal having the at least one predetermined logic voltage level, wherein said at least one interval comprises an interval when the chip select signal activates said integrated circuit.

5. The integrated circuit of claim 4, wherein said control logic further comprises:

an output control logic, coupled to said digital filter, for receiving the multiple bit representation from the digital filter and outputting as the digital signal a serial data stream.

6. The integrated circuit of claim 5, wherein said signal output further comprises a serial data output.

7. The integrated circuit of claim 6, wherein said switching means comprises:

at least one T-gate, coupled to the chip select signal input and the serial data output, said at least one T-gate being switched on in response to a first predetermined logic signal from said output control logic.

8. The integrated circuit of claim 2, wherein said at least one signal input further comprises:

at least two signal inputs, for receiving respective logic signals comprising $IN_H$ and $IN_L$, respectively, each respective logic signals having at least one predetermined logic voltage level during at least one interval.

9. The integrated circuit of claim 8, wherein said switching means comprises:

at least one T-gate, each of said at least one T-gate coupled to a corresponding one of the at least two signal inputs and the serial data output, said at least one T-gate being switched on in response to a first predetermined logic signal from said output control logic.

10. The integrated circuit of claim 9, wherein said at least one T-gate further comprises:

a first T-gate, coupled to a corresponding one of the at least two signal inputs and the serial data output, for receiving the logic signal $IN_H$, said first T-gate being switched on in response to a first predetermined logic signal from said output control logic; and a second T-gate, coupled to a corresponding other one of the at least two signal inputs and the serial data output, for receiving the logic signal $IN_L$, said second T-gate being switched on in response to a second predetermined logic signal from said output control logic.

11. The integrated circuit of claim 1, further comprising:

an input threshold logic detector, coupled to said at least one power supply input, for generating at least one input logic level threshold value as a function of said at least one power supply input.

12. The integrated circuit of claim 11, wherein said at least one power supply input further comprises:

at least two power supply inputs, comprising at least a V+ input and a V− input, each for receiving respective power supply voltage levels unequal to and independent from, the predetermined logic voltage level.

13. The integrated circuit of claim 12, wherein said at least one input logic level threshold value comprises a high level logic threshold value $V_{IH}$ calculated as:

$$V_{IH}=V+-0.45.$$

14. The integrated circuit of claim 12, wherein said at least one input logic level threshold value comprises a low level logic threshold value $V_{IL}$ calculated as:

$$V_{IL}=0.5\times(V+-V-)+0.6+V-.$$

15. A method for use with an integrated circuit in an electrical system having at least one predetermined logic voltage level, the method comprising the steps of:

receiving, in at least one power supply input, a power supply voltage level unequal to and independent from, the predetermined logic voltage level, receiving, in at least one signal input, a logic signal having the at least one predetermined logic voltage level during at least one interval, generating, in a control logic, coupled to the power supply input, a digital signal, outputting, from a signal output, a digital logic signal from the integrated circuit, and selectively switching, using a switch coupled to the control logic, the signal output, and the at least one signal input, the at least one signal input to the signal output, in response to the control logic, so as to generate the digital logic signal having at least one voltage level substantially equal to the at least one predetermined logic voltage level.

16. The method of claim 15, wherein the step of receiving, in at least one power supply input, a power supply voltage level unequal to and independent from, the predetermined logic voltage level further comprises the step of:

receiving, in each of at least two power supply inputs, comprising at least a V+ input and a V− input, respective power supply voltage levels unequal to and independent from, the predetermined logic voltage level.

17. The method of claim 16, wherein the integrated circuit comprises an analog-to-digital converter, the method further comprising the step of:

receiving, in at least one analog input, an analog input signal, reducing current draw of the at least one analog input using at least one buffer amplifier, generating, using a differential 4th order delta-sigma modulator coupled to the at least one analog input, a digital bitstream value corresponding to the analog input signal, and converting, using a digital filter, the digital bitstream value into a multiple bit representation to reducing word rate.

18. The method of claim 17, wherein said step of receiving, in at least one signal input, a logic signal having the at least one predetermined logic voltage level during at least one interval, further comprises the step of:

receiving, in a chip select signal input, a low level logic signal having the at least one predetermined logic voltage level, wherein the at least one interval comprises an interval when the chip select signal activates the integrated circuit.

19. The method of claim 18, wherein said step of generating, in a control logic, coupled to the power supply input, a digital signal further comprises the steps of:

receiving, in an output control logic coupled to the digital filter, the multiple bit representation from the digital filter, and outputting, from the control logic, a serial data stream as the digital signal.

20. The method of claim 19, wherein the signal output further comprises a serial data output.

21. The method of claim 20, wherein said step of selectively switching further comprises the step of:

switching at least one T-gate coupled to the chip select signal input and the serial data output in response to a first predetermined logic signal from the output control logic.

22. The method of claim 16, wherein said step of receiving, in at least one signal input, a logic signal having the at least one predetermined logic voltage level during at least one interval further comprises the step of:

receiving, in at least two signal inputs, respective logic signals comprising $IN_H$ and $IN_L$, respectively, each respective logic signals having at least one predetermined logic voltage level during at least one interval.

23. The method of claim 22, wherein said step of selectively switching further comprises the step of:

switching, in response to a first predetermined logic signal from the output control logic, at least one T-gate, each of the at least one T-gate coupled to a corresponding one of the at least two signal inputs and the serial data output.

24. The method of claim 23, wherein said step of selectively switching further comprises the steps of:

receiving in a first T-gate coupled to a corresponding one of the at least two signal inputs and the serial data output, the logic signal $IN_H$, switching the first T-gate in response to a first predetermined logic signal from the output control logic, receiving in a second T-gate coupled to a corresponding other one of the at least two signal inputs and the serial data output, the logic signal $IN_L$, and switching the second T-gate in response to a second predetermined logic signal from the output control logic.

25. The method of claim 15, further comprising:

generating, in an input threshold logic detector coupled to the at least one power supply input, at least one input logic level threshold value as a function of the at least one power supply input.

26. The method of claim 25, wherein said step of generating, in an input threshold logic detector coupled to the at least one power supply input, at least one input logic level threshold value as a function of the at least one power supply input comprises the step of:

receiving, in each of at least two power supply inputs comprising at least a V+ input and a V− input, respective power supply voltage levels unequal to and independent from, the predetermined logic voltage level.

27. The method of claim 26, wherein the at least one input logic level threshold value comprises a high level logic threshold value $V_{IH}$ calculated as:

$$V_{IH} = V+ - 0.45.$$

28. The method of claim 26, wherein the at least one input logic level threshold value comprises a low level logic threshold value $V_{IL}$ calculated as:

$$V_{IL} = 0.5 \times (V+ - V-) + 0.6 + V-.$$

* * * * *